United States Patent
Kukulka

(10) Patent No.: US 8,664,517 B2
(45) Date of Patent: Mar. 4, 2014

(54) SOLAR CELL ASSEMBLY WITH COMBINED HANDLE SUBSTRATE AND BYPASS DIODE AND METHOD

(75) Inventor: Jerry R. Kukulka, Santa Clarita, CA (US)

(73) Assignee: The Boeing Company, Chicago, IL (US)

( * ) Notice: Subject to any disclaimer, the term of this patent is extended or adjusted under 35 U.S.C. 154(b) by 14 days.

(21) Appl. No.: 13/606,002

(22) Filed: Sep. 6, 2012

(65) Prior Publication Data
US 2012/0329199 A1    Dec. 27, 2012

Related U.S. Application Data

(62) Division of application No. 12/413,353, filed on Mar. 27, 2009, now Pat. No. 8,283,558.

(51) Int. Cl.
*H01L 31/00* (2006.01)
*H01L 21/00* (2006.01)

(52) U.S. Cl.
USPC ............................................. 136/255; 438/66

(58) Field of Classification Search
CPC ............ H01L 27/1421; H01L 31/0687; H01L 31/06875; H01L 31/072; H01L 31/0725; H01L 31/1892; H01L 31/1896
USPC .............................................. 438/66; 136/255
See application file for complete search history.

(56) References Cited

U.S. PATENT DOCUMENTS

| | | | |
|---|---|---|---|
| 2005/0072457 A1* | 4/2005 | Glenn | 136/246 |
| 2006/0021565 A1* | 2/2006 | Zahler et al. | 117/89 |
| 2010/0031994 A1* | 2/2010 | Varghese | 136/244 |
| 2010/0116325 A1* | 5/2010 | Nikoonahad | 136/251 |

* cited by examiner

*Primary Examiner* — Eli Mekhlin

(57) ABSTRACT

A solar cell assembly and method are disclosed. The solar cell assembly comprises a substrate having a front surface and a back surface, wherein the substrate has a p-n junction providing reverse bias protection, and wherein the substrate functions as a bypass diode. The solar cell assembly further comprises a multijunction solar cell having a plurality of solar cell layers, wherein the multijunction solar cell has a first surface and a second surface, the first surface being attached to the front surface of the substrate. The solar cell assembly further comprises an electrical connector element positioned adjacent the front surface of the substrate and the first surface of the multijunction solar cell, a first contact coupled to the back surface of the substrate, and at least one second contact coupled to a portion of the second surface of the multijunction solar cell.

20 Claims, 4 Drawing Sheets

SOLAR CELL ASSEMBLY WITH COMBINED HANDLE SUBSTRATE AND BYPASS DIODE AND METHOD

CROSS-REFERENCE TO RELATED APPLICATIONS

The present application is a divisional of and claims priority to application Ser. No. 12/413,353, filed Mar. 27, 2009, now U.S. Pat. No. 8,283,558, and entitled SOLAR CELL ASSEMBLY WITH COMBINED HANDLE SUBSTRATE AND BYPASS DIODE AND METHOD, the entire contents of which is incorporated herein by reference.

BACKGROUND

1) Field of the Disclosure

The disclosure relates generally to solar cells, and more specifically to inverted metamorphic solar cells and thin multijunction solar cells.

2) Description of Related Art

Solar cells or photovoltaic cells are devices designed to convert available light into electrical energy. Assemblies of such cells may be used to make solar panels, solar modules, or photovoltaic arrays, which can, in turn, be used to provide electrical power for a variety of applications such as satellites, spacecraft, and other space related applications; solar powered aircraft, high altitude unmanned aircraft, and other aircraft applications; and other suitable applications. In such applications, size, weight, and cost are factors to be considered, for example, the size, weight and cost of a satellite power system may be dependent on the energy and power conversion efficiency of the solar cells used.

A solar cell may include a flat photovoltaic wafer made from p-type or n-type crystalline semiconductor material, such as silicon, gallium arsenside, germanium, or another suitable material, in or on which a thin surface layer of the opposite conductivity type may be formed. The interface between the surface layer and the main region of the wafer defines a semiconductor junction. Solar cells may be modeled as diodes that respond to illumination by becoming forward biased and establishing a voltage across the cell. In addition, multijunction solar cells, formed from a combination of group III to group V materials and commonly referred to as Advanced "III-V" cells, may produce a somewhat higher forward voltage.

The solar cells may be assembled into arrays of solar cells connected together in series strings to provide a desired voltage, in parallel to provide a desired current, or in a series-parallel combination. When all of the solar cells in an array are illuminated, the solar cells are forward biased, and they each produce their respective voltage or current outputs which sum together to maintain the desired overall output. However, if one or more of the solar cells becomes shadowed, or not illuminated, those cells may become reverse biased due to the voltage generated by the unshadowed cells. For example, a spacecraft antenna may cast a shadow across an array. The effect of shadowing a solar cell in a series string depends upon the specific characteristics of the solar cell. If the solar cell has a very low reverse current, reverse biasing the cell can effectively force the string output to zero. If the cell electrically breaks down at a relatively low reverse voltage, the effect of shadowing a solar cell on the string output is reduced. Reverse biasing of a cell can cause permanent degradation or damage in cell performance or even complete cell failure.

Bypass diodes, typically made of silicon, may be used to minimize output losses and to protect cells against reverse bias when they become shadowed. Bypass diodes may be connected across single cells, across strings of cells, or across rows of parallel-connected cells. Bypass diodes that have very low reverse currents can avoid reducing current in the solar cell during normal operation, which can reduce power efficiency. When the cell becomes shadowed, the current flow through the cell may be limited, causing the cell to become reverse biased. This can cause the bypass diode to become forward biased. Most of the current can flow through the bypass diode rather than through the shadowed cell, thus allowing current to continue flowing through the array. The bypass diode can limit the reverse bias voltage across the cell thereby protecting the shadowed cell.

Known methods have been used to provide solar cells, including inverted metamorphic (IMM) solar cells, with bypass diode protection. One known method uses a bypass diode in the form of a discrete silicon flat diode. Such known bypass diode is typically separately mounted to a back surface of the solar cell. The bypass diode can protrude from the back surface of the solar cell thus making bonding more difficult. When the solar cell is cracked, portions of the solar cell may not be protected by the bypass diode. In addition, the bypass diode may be affixed to a corner of the solar cell thus making automated handling a challenge. Such known method may result in complex and inefficient assembly because the method may require the connection of adjoining cells to be formed by the assembler of the array rather than the cell manufacturer, thus resulting in increased cost.

Another known method uses a bypass diode in the form of a monolithic diode that can be built into the solar cell epitaxial (EPI) structure, wherein the epitaxial structure is defined for purposes of this application as the growth of a crystalline film on a crystalline substrate such that the film and substrate have the same structural orientation. Inverted metamorphic (IMM) solar cells or other thin multijunction cells may require a handle substrate for ease of handling. A handle substrate, or base substrate, of such known bypass diode is typically a separate component that is bonded to the solar cell or IMM solar cell structure. The handle substrate is used to provide mechanical support for the thin solar cell structure. Typically, the handle substrate may be made of germanium. However, germanium is a dense material and can be expensive, heavy, and brittle. Increased weight can affect mass sensitive missions by spacecraft or other high specific power applications, and the handle substrate may have decreased robustness due to the brittleness of germanium. Moreover, the known monolithic diode may be difficult to incorporate into the solar cell, IMM solar cell, or other cell structure and may be unstable in higher operating temperature applications.

In addition, methods for attaching the handle substrate to solar cell or thin IMM solar cell structures are known. Such known methods may include direct bonding or soldering. However, such known methods can result in electrical performance degradation, breakage, poor bond uniformity, unknown thermal cycle performance, and increased expense, and may use low throughput bonding equipment.

Accordingly, there is a need for a thin multijunction solar cell or inverted metamorphic (IMM) solar cell and method that provides advantages over known solar cells and methods.

SUMMARY

This need for a thin multijunction solar cell or inverted metamorphic (IMM) solar cell and method that provides advantages over known cells and methods is satisfied. Unlike known solar cells and methods, embodiments of the solar cell and method of the disclosure may provide one or more of the following advantages: provides a thin multijunction solar cell or inverted metamorphic (IMM) solar cell and method having a combined handle substrate and bypass diode, such that the handle substrate has a p-n junction capable of providing bypass protection and reverse bias protection; provides a thin multijunction solar cell or inverted metamorphic (IMM) solar cell and method having decreased mass and cost, improved handling, and simplified assembly; provides a thin multijunction solar cell or inverted metamorphic (IMM) solar cell and method having a handle substrate with a mass that may be about 45% less mass for an equivalent handle thickness of germanium; provides a thin multijunction solar cell or inverted metamorphic (IMM) solar cell and method that may be used in satellites, spacecraft, and other space related applications; solar powered aircraft, high altitude unmanned aircraft, and other suitable aircraft applications; applications where high specific power is needed; portable power applications; and other suitable applications; provides a thin multijunction solar cell or inverted metamorphic (IMM) solar cell and method that minimizes or eliminates electrical performance degradation, breakage, poor bond uniformity, and unknown thermal cycle performance, and the use of low throughput bonding equipment; provides a thin multijunction solar cell or inverted metamorphic (IMM) solar cell and method where the combined substrate and bypass diode may be manufactured by the cell manufacturer as an integral part of the cell itself, taking the responsibility for the bypass diode away from the array assembler; provides a thin multijunction solar cell or inverted metamorphic (IMM) solar cell and method having high efficiency cells with the ability to convert 30-33% of sunlight energy into electrical energy; and provides a thin multijunction solar cell or inverted metamorphic (IMM) solar cell and method having a combined handle substrate and bypass diode with contact across the entire bypass diode to provide improved bypass protection in the case of a cell crack and to provide bypass protection to each portion of a cracked cell.

In an embodiment of the disclosure, a solar cell assembly is disclosed. The solar cell assembly comprises a substrate having a front surface and a back surface. The substrate has a p-n junction providing reverse bias protection, and the substrate functions as a bypass diode. The solar cell assembly further comprises a multijunction solar cell having a plurality of solar cell layers. The multijunction solar cell has a first surface and a second surface, the first surface being attached to the front surface of the substrate. The solar cell assembly further comprises an electrical connector element wherein a portion of the electrical connector element is positioned adjacent the front surface of the substrate and the first surface of the multijunction solar cell. The solar cell assembly further comprises a first contact coupled to the back surface of the substrate and at least one second contact coupled to a portion of the second surface of the multijunction solar cell.

In another embodiment of the disclosure, an inverted metamorphic solar cell assembly is disclosed. The inverted metamorphic solar cell assembly comprises a silicon handle substrate having a front surface and a back surface, wherein the substrate has a p-n junction providing reverse bias protection, and wherein the substrate functions as a bypass diode. The solar cell assembly further comprises an inverted metamorphic solar cell having a plurality of solar cell layers, wherein the inverted metamorphic solar cell has a first surface and a second surface, the first surface being attached to the front surface of the substrate. The solar cell assembly further comprises an electrical connector element wherein a portion of the electrical connector element is positioned adjacent the front surface of the substrate and the first surface of the inverted metamorphic solar cell, and wherein the electrical connector element comprises an electrically conductive metal. The solar cell assembly further comprises a first metal contact having a first polarity coupled to the back surface of the substrate and at least one second metal contact having a second polarity coupled to a portion of the second surface of the inverted metamorphic solar cell.

In another embodiment of the disclosure, a method for enhancing performance of a solar cell assembly is disclosed. The method comprises forming on a first substrate a multijunction solar cell having a plurality of solar cell layers, wherein the multijunction solar cell has a first surface and a second surface. The method further comprises providing a second substrate having a front surface and a back surface, wherein the second substrate has a p-n junction providing reverse bias protection, and wherein the substrate functions as a bypass diode. The method further comprises coupling an electrical connector element to a portion of the front surface of the second substrate. The method further comprises attaching the first surface of the multijunction solar cell to the front surface of the second substrate, wherein the electrical connector element is positioned adjacent the front surface of the second substrate and the first surface of the multijunction solar cell. The method further comprises removing the first substrate from the multijunction solar cell, coupling a first contact to the back surface of the second substrate, and coupling at least one second contact to a portion of the second surface of the multijunction solar cell.

In another embodiment of the disclosure, a method for enhancing performance of an inverted metamorphic solar cell assembly is disclosed. The method comprises forming on a germanium growth substrate an inverted metamorphic solar cell having a plurality of solar cell layers, wherein the inverted metamorphic solar cell has a first surface and a second surface. The method further comprises providing a silicon handle substrate having a front surface and a back surface, wherein the silicon handle substrate has a p-n junction providing reverse bias protection, and wherein the silicon handle substrate functions as a bypass diode. The method further comprises coupling an electrical connector element to a portion of the front surface of the silicon handle substrate, wherein the electrical connector element comprises an electrically conductive metal. The method further comprises attaching the first surface of the inverted metamorphic solar cell to the front surface of the silicon handle substrate, wherein the electrical connector element is positioned adjacent the front surface of the silicon handle substrate and the first surface of the inverted metamorphic solar cell. The method further comprises removing the germanium growth substrate from the second surface of the inverted metamorphic solar cell. The method further comprises coupling a first metal contact having a first polarity to the back surface of the silicon handle substrate, coupling at least one second metal contact having a second polarity to a portion of the second surface of the inverted metamorphic solar cell, and providing an interconnect element for attaching the inverted metamorphic solar cell assembly to a second inverted metamorphic solar cell assembly, wherein the interconnect element has a top portion attached to the at least one second metal contact, a bottom portion attached to the first metal contact, and a middle portion attached to an electrical connector element of the second inverted metamorphic solar cell assembly.

The features, functions, and advantages that have been discussed can be achieved independently in various embodiments of the disclosure or may be combined in yet other embodiments further details of which can be seen with reference to the following description and drawings.

BRIEF DESCRIPTION OF THE DRAWINGS

The disclosure can be better understood with reference to the following detailed description taken in conjunction with the accompanying drawings which illustrate preferred and exemplary embodiments, but which are not necessarily drawn to scale, wherein.

DETAILED DESCRIPTION

Disclosed embodiments will now be described more fully hereinafter with reference to the accompanying drawings, in which some, but not all of the disclosed embodiments are shown. Indeed, several different embodiments may be provided and should not be construed as limited to the embodiments set forth herein. Rather, these embodiments are provided so that this disclosure will be thorough and complete and will fully convey the scope of the disclosure to those skilled in the art.

The disclosure provides for a solar cell assembly and method that may be used in satellites, spacecraft, and other space related applications; solar powered aircraft, high altitude unmanned aircraft, and other suitable aircraft applications; applications where high specific power is needed; portable power applications; and other suitable applications. Accordingly, one of ordinary skill in the art will recognize and appreciate that the solar cell assembly and method may be used in any number of applications involving satellites, spacecraft, and other space related applications; solar powered aircraft, high altitude unmanned aircraft, and other suitable aircraft applications; applications where high specific power is needed; portable power applications; and other suitable applications.

Figure 1:
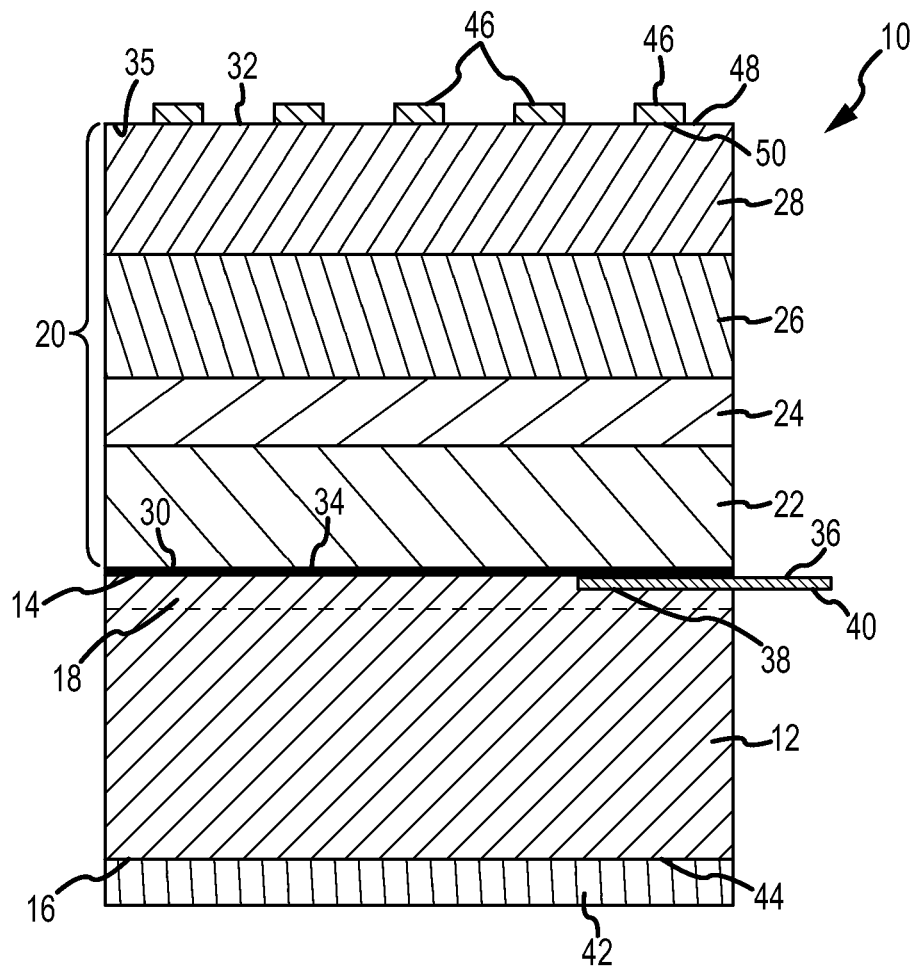
FIG. 1 is an illustration in cross section of an advantageous embodiment of a solar cell assembly of the disclosure.

Referring more particularly to the drawings, FIG. 1 is an illustration in cross section of an advantageous embodiment of a solar cell assembly 10. The solar cell assembly 10 comprises a substrate 12 having a front surface 14 and a back surface 16. The substrate 12 is preferably a handle substrate comprising a material such as silicon, silicon on sapphire, amorphous silicon, aluminum, germanium, or another suitable material. Preferably, the material is silicon. The substrate 12 has a p-n junction 18 providing reverse bias protection. The p-n junction 18 may comprise a simple diffused p-n junction or another suitable p-n junction. The p-n junction is a junction formed by combining p-type and n-type semiconductor materials in close contact. The substrate 12 functions as a bypass diode, and thus, the substrate and bypass diode are combined into one, simplifying assembly as opposed to being separately attached elements. Because contact is across the entire combined substrate 12 and bypass diode rather than a discrete diode, improved bypass protection is provided to the multijunction solar cell. With the disclosed solar cell assembly 10, even if the cell cracks, it is still protected against reverse bias degradation. Silicon or one of the other suitable substrates is preferred over substrates such as germanium because silicon is about half the density and mass of germanium. Silicon has less mass and can result in the overall solar cell assembly having less mass. This can be advantageous for space based solar arrays where mass is a consideration. This can also be advantageous for solar powered aircraft, such as high altitude long endurance (HALE) aircraft, where the solar energy conversion efficiency provided by solar cells, such as inverted metamorphic solar cells, affects the mass. In addition, other applications where high specific power may be used, such as portable power for military applications, can benefit from the disclosed solar cell. Moreover, a silicon handle substrate may be less costly than a germanium handle substrate. A substrate comprising silicon on sapphire may also be used at some mass impact. A substrate comprising amorphous silicon may also be used, providing the p-n junction provides the appropriate reverse bias protection, does not exhibit high reverse leakage, and has acceptable mass and handling characteristics. The substrate 12 may have a thickness in the range of about 0.001 inch to about 0.002 inch.

The solar cell assembly 10 further comprises a multijunction solar cell 20 having a plurality of solar cell layers 22, 24, 26, 28. For example, solar cell layer 22 may comprise gallium indium phosphide (GaInP) or another suitable material. For example, solar cell layer 24 may comprise a transparent buffer material or another suitable material. For example, solar cell layer 26 may comprise gallium indium phosphide (GaInP) or another suitable material. For example, solar cell layer 28 may comprise gallium indium phosphide (GaInP) or another suitable material. It should be noted that the multijunction solar cell 20 structure may be formed of any suitable combination of group III to group V elements listed in the periodic table subject to lattice constant and band gap requirements, wherein the group III elements include boron (B), aluminum (Al), gallium (Ga), indium (In), and thallium (T); the group IV elements include carbon (C), silicon (Si), germanium (Ge), and tin (Sn); and the group V elements include nitrogen (N), phosphorous (P), arsenic (As), antimony (Sb), and bismuth (Bi). Although four solar cell layers are shown, more than four solar cell layers, or one, two, or three solar cell layers may also be used. The layers 22, 24, 26, 28 may each have a thickness in the range of about 0.5 micron to about 3.5 microns. The multijunction solar cell 20 may be fabricated in vertical, multijunction structures, and disposed in horizontal arrays, with the individual solar cell layers connected together in a series. The shape and structure of an array, as well as the number of cells it contains, are determined in part by the desired output voltage and current. The overall multijunction solar cell may have a thickness of about 0.5 mil (0.0005 inch) thick or in the range of about 0.4 mil (0.0004 inch) to about 0.6 mil (0.0006 inch).

As shown in FIG. 1, the multijunction solar cell 20 has a first surface 30 and a second surface 32. The first surface 30 is attached to the front surface 14 of the substrate 12. The first surface 30 of the multijunction solar cell 20 faces and typically contacts the substrate 12, and is opposite the oppositely disposed second surface 32 of the multijunction solar cell 20. A conductive bonding material 34 may be used to bond the front surface 14 of the substrate 12 to the first surface 30 of the multijunction solar cell 20. The conductive bonding material 34 may comprise silicone, epoxy, solder, braze, or another suitable conductive bonding material. A silicone conductive bonding material may be used to bond the multijunction solar cell 20 to the substrate 12 since the current conduction through the silicone may be during reverse bias, making the substrate 12 attach process simpler than known direct bonding or solder approaches. Other attachment methods for attaching the multijunction solar cell 20 to the substrate 12 may also be used. The multijunction solar cell 20 may comprise an inverted metamorphic solar cell 76 (see FIG. 4), thin multijunction solar cells, thin films, or other suitable solar cells. The multijunction solar cell 20 may comprise at least one junction 35 below a second surface 32 of the multijunction solar cell 20.

The solar cell assembly 10 further comprises an electrical connector element 36. A portion 38 of the electrical connector element 36, such as an interior portion, is positioned adjacent the front surface 14 of the substrate 12 and the first surface 30 of the multijunction solar cell 20. An exterior portion 40 of the electrical connector element 36 may protrude exteriorly to the solar cell assembly 10. The portion 38 of the electrical connector element 36 may be coupled or attached to the front surface 14 of the substrate 12 via bonding with conductive bonding material or another suitable bonding process. The electrical connector element 36 may be in the configuration of an electrical contact tab 84 (see FIGS. 5-7) or another suitable configuration. The electrical connector element 36 may comprise an electrically conductive metal or another suitable material. The electrical connector element 36 may have a thickness in the range of about 0.0005 inch to about 0.002 inch. The electrical connector element 36 provides bypass connection to the solar cell assembly 10. The solar cell assembly 10 further comprises a first contact 42 having a front surface 44 coupled to the back surface 16 of the substrate 12. The first contact 42 is preferably a metal contact having a first polarity. The first contact 42 may be in the form of a metallic layer that overlies the back surface 16 of the substrate 12. The first contact 42 may have a thickness in the range of about 5 microns to about 7 microns. The solar cell assembly 10 further comprises at least one second contact 46 having a back surface 48 coupled to a portion 50 of the second surface 32 of the multijunction solar cell 20. The second contact 46 is preferably a metal contact having a second polarity. The second contact 46 may be in the form of metallic strips overlying the second surface 32 of the multijunction solar cell 20. The second contact 46 may have a thickness in the range of about 5 microns to about 7 microns. The first contact 42 and the second contact 46 may collect the multijunction solar cell 20 electrical current resulting from electrical carriers produced by the multijunction solar cell layers 22, 26, 28.

Figure 2:
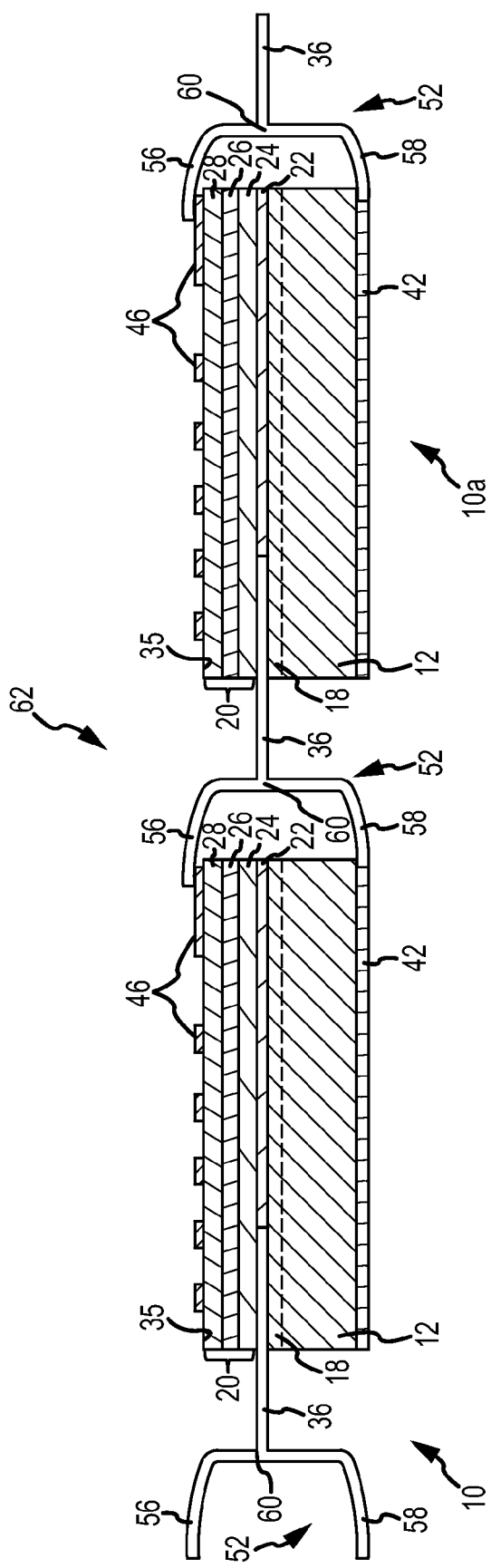
FIG. 2 is an illustration in cross section of an inter cell attachment of advantageous embodiments of solar cell assemblies of the disclosure.

As shown in FIG. 2, the solar cell assembly 10 may further comprise an interconnect element 52 for attaching the solar cell assembly 10 to a second solar cell assembly 10a. The interconnect element 52 may have a top portion 56 attached to the at least one second contact 46, a bottom portion 58 attached to the first contact 42, and a middle portion 60 attached to the electrical connector element 36 of the second solar cell assembly 10a. The solar cell assembly 10 may be used in satellites, spacecraft, solar powered aircraft, high altitude unmanned aircraft, aircraft, and portable power devices, dirigibles, or other suitable vehicles or devices. FIG. 2 is an illustration in cross section of an inter cell attachment 62 of the solar cell assembly 10 and the second solar sell assembly 10a of the disclosure. The solar cell assembly 10 and the second solar cell assembly 10a both include substrate 12, p-n junction 18, multijunction solar cell 20 having layers 22, 24, 26, 28, electrical connector element 36, first contact 42, and second contact 46. The solar cell assemblies may be electrically connected to each other by electrical connections in a series and/or parallel array to produced a required voltage and current output of the solar cell assembly.

Figure 3:
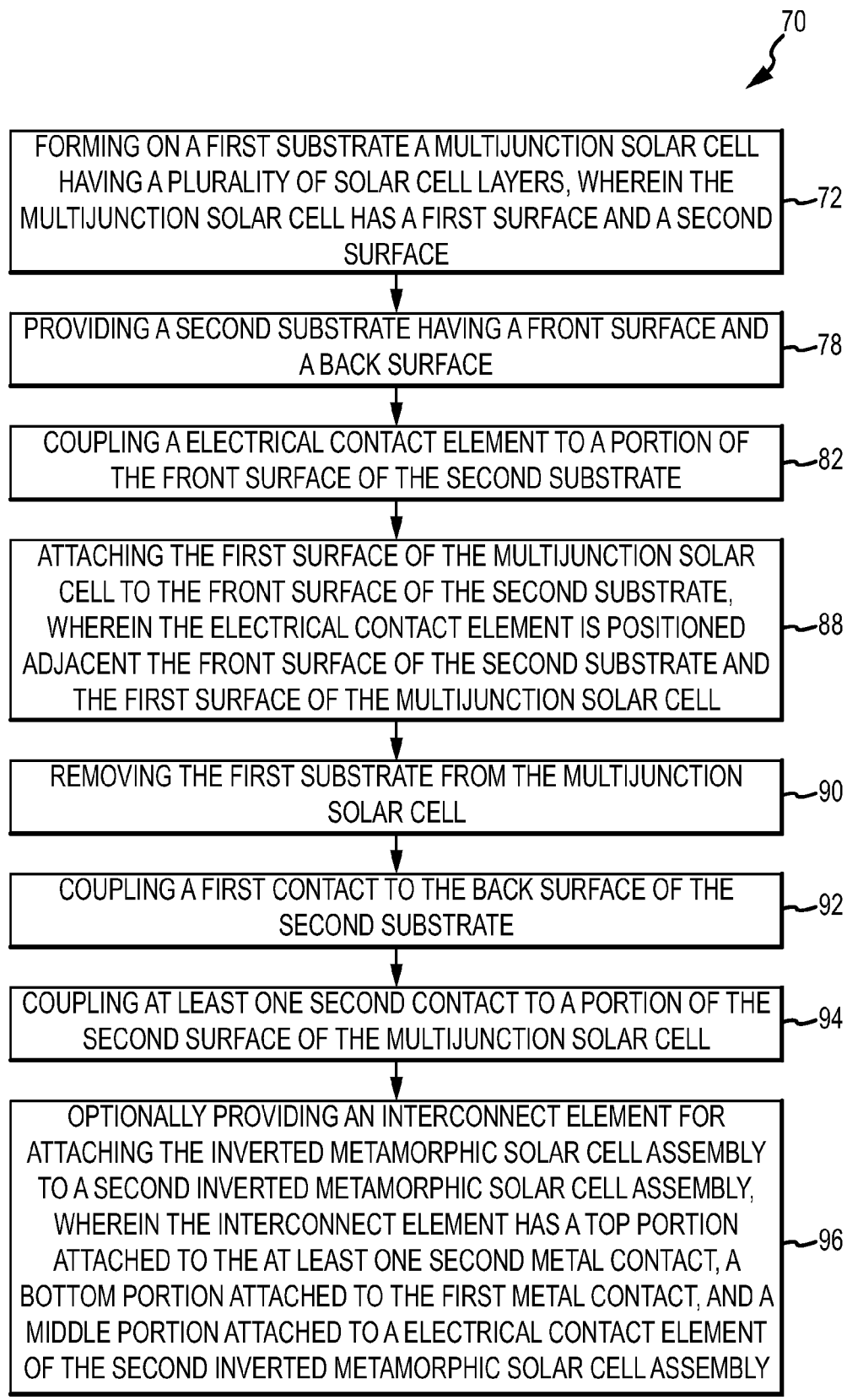
FIG. 3 is an illustration of a flow diagram of an advantageous embodiment of a method of the disclosure.
Figures 4, 5, 6, 7:
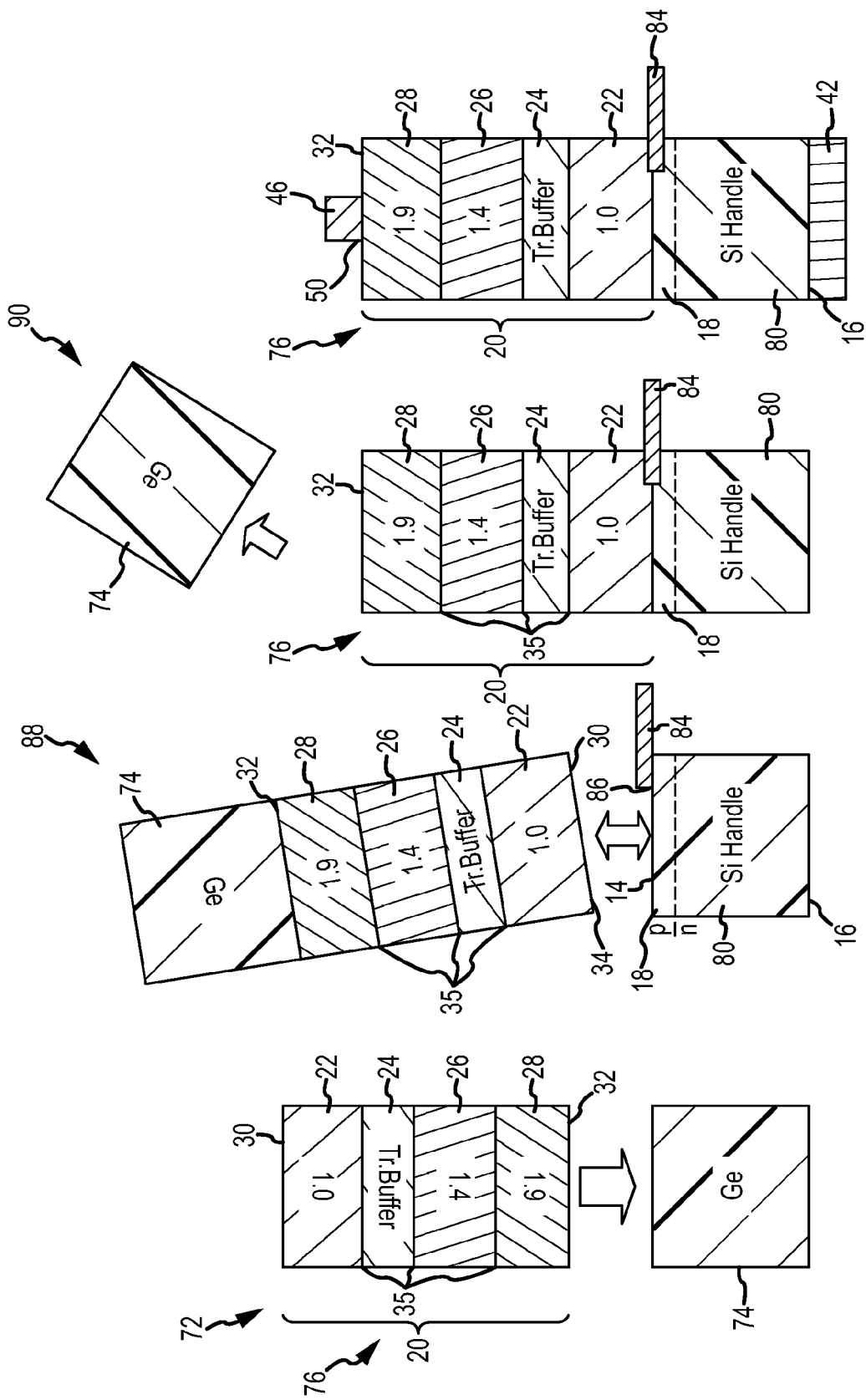
FIG. 4 is an illustration in cross section of a solar cell formed in a method step of an advantageous embodiment of the method of the disclosure.
FIG. 5 is an illustration in cross section of a solar cell attached to a second substrate having an electrical connector element in another method step of an advantageous embodiment of the method of the disclosure.
FIG. 6 is an illustration in cross section of a solar cell attached to a second substrate having an electrical connector element and removing a first substrate in another method step of an advantageous embodiment of the method of the disclosure; and, FIG. 7 is an illustration in cross section of an advantageous embodiment of a solar cell with combined handle substrate and bypass diode after the completion of method steps of an advantageous embodiment of the method of the disclosure.

FIG. 3 is an illustration of a block flow diagram of the steps of an advantageous embodiment of a method 70 of the disclosure. In this embodiment of the disclosure, there is provided a method 70 for enhancing performance of a solar cell assembly 10 (see FIG. 1). The method 70 comprises step 72 of forming on a first substrate 74 (see FIG. 4) a multijunction solar cell 20 having a plurality of solar cell layers 22, 24, 26, 28. The multijunction solar cell 20 has a first surface 30 and a second surface 32. The multijunction solar cell 20 is preferably an inverted metamorphic solar cell 76. The first substrate 74 may be a growth substrate or growth seed substrate comprised of a material such as germanium, gallium arsenside, silicon, or other compatible semiconductor materials. The multijunction solar cell 20 may be grown on the first substrate 74. FIG. 4 is an illustration in cross section of the multijunction solar cell 20, preferably an inverted metamorphic solar cell 76, formed on first substrate 74 in method step 72. The solar cell layers may be formed or grown via epitaxy or another suitable process.

The method further comprises step 78 of providing a second substrate 80 having a front surface 14 and a back surface 16. The second substrate 80 may be a handle substrate comprised of a material such as silicon, silicon on sapphire, amorphous silicon, aluminum, germanium, or another suitable material. Preferably, the second substrate 80 is a silicon handle substrate as shown in FIG. 5. The second substrate 80 has a p-n junction 18 providing reverse bias protection. The p-n junction 18 may comprise a simple diffused p-n junction or another suitable p-n junction. The second substrate 80 functions as a bypass diode, and thus, the substrate and bypass diode are combined into one, simplifying assembly as opposed to being separately attached elements. The method further comprises step 82 of coupling an electrical connector element 36 in the form of an electrical contact tab 84 to a portion 86 of the front surface 14 of the second substrate 80. The electrical connector element 36 may be coupled or attached to the second substrate 80 via bonding with conductive bonding material or another suitable bonding process. The electrical connector element 36 may be comprised of an electrically conductive metal or another suitable material.

The method further comprises step 88 of attaching the first surface 30 of the multijunction solar cell 20 to the front surface 14 of the second substrate 80. The electrical contact tab 84 is positioned adjacent the front surface 14 of the second substrate 80 and the first surface 30 of the multijunction solar cell 20. Conductive bonding material 34 may be used to bond the front surface 14 of the second substrate 80 to the first surface 30 of the multijunction solar cell 20. The conductive bonding material 34 may comprise silicone, epoxy, solder, braze, or another suitable conductive bonding material may be used. FIG. 5 is an illustration in cross section of the multijunction solar cell 20, preferably an inverted metamorphic solar cell 76, formed on first substrate 74 and attached to the second substrate 80 having the electrical contact tab 84 in method step 88.

The method further comprises step 90 of removing the first substrate 74 from the multijunction solar cell 20. FIG. 6 is an illustration in cross section of the multijunction solar cell 20, preferably an inverted metamorphic solar cell 76, attached to the second substrate 80 having the electrical contact tab 84 and removing the first substrate 74 in method step 90. The first substrate 74 may be removed by etching or another suitable removal process.

The method further comprises step 92 of coupling first contact 42 to the back surface 16 of the second substrate 80. The first contact 42 is preferably a metal contact and may be coupled or attached to the back surface 16 of the second substrate 80 via vacuum deposition or another suitable process. The method further comprises step 94 of coupling at least one second contact 46 to a portion 50 of the second surface 32 of the multijunction solar cell 20. The second contact 46 is preferably a metal contact and may be coupled or attached to the portion 50 of the second surface 32 of the multijunction solar cell 20 via vacuum deposition or another suitable process. FIG. 7 is an illustration in cross section of the multijunction solar cell 20, preferably an inverted metamorphic solar cell 76, attached to the second substrate 80 having the electrical contact 84 and having the first contact 42 and second contact 46 attached after the completion of method steps 92, 94.

The method in one embodiment may optionally further comprise step 96 of providing an interconnect element 52 for attaching the solar cell assembly 10 to a second solar cell assembly 10a (see FIG. 2), wherein the interconnect element 52 has a top portion 56 attached to the at least one second contact 46, a bottom portion 58 attached to the first contact 42, and a middle portion 60 attached to the electrical connector element 36 of the second solar cell assembly 10a. The method may be used for enhancing performance of solar cell assemblies for use in satellites, spacecraft, solar powered aircraft, high altitude unmanned aircraft, aircraft, portable power devices and other suitable applications.

The disclosed solar cell assembly 10 combines the substrate 12, preferably in the form of a silicon handle substrate 80, and bypass diode for reverse bias protection. Subsequent assembly may be simpler with the disclosed solar cell assembly 10. For a design incorporating the disclosed solar cell assembly 10 with silicon handle substrate 80, a mass savings for a typical satellite may be about 50 kilograms, resulting in a significant cost savings. For a HALE mission of 250 kw (kilowatts), there may be a reduction of 250 kg (kilograms) per vehicle, a substantial fraction of the vehicle's mass. The solar cell assembly 10 of the disclosure provides a lightweight, weight saving and cost saving design and method for aerospace, aircraft and other suitable applications.

Many modifications and other embodiments of the disclosure will come to mind to one skilled in the art to which this disclosure pertains having the benefit of the teachings presented in the foregoing descriptions and the associated drawings. The embodiments described herein are meant to be illustrative and are not intended to be limiting. Although specific terms are employed herein, they are used in a generic and descriptive sense only and not for purposes of limitation.

What is claimed is:

1. A method for enhancing performance of a solar cell assembly comprising:
    forming on a first substrate a multijunction solar cell having a plurality of solar cell layers, wherein the multijunction solar cell has a first surface and a second surface;
    providing a handle substrate having a front surface and a back surface, wherein the handle substrate has a p-n junction providing reverse bias protection, and wherein the handle substrate functions as a bypass diode;
    coupling an electrical connector element to a portion of the front surface of the handle substrate;
    attaching the first surface of the multijunction solar cell to the front surface of the handle substrate, wherein the electrical connector element is positioned adjacent the front surface of the handle substrate and the first surface of the multijunction solar cell;
    removing the first substrate from the multijunction solar cell;
    coupling a first contact to the back surface of the handle substrate;
    coupling at least one second contact to a portion of the second surface of the multijunction solar cell; and,
    providing improved bypass protection to the multijunction solar cell by combining the handle substrate and the bypass diode into one assembly with the entire front surface of the combined handle substrate and bypass diode in contact with the entire first surface of the multijunction solar cell.

2. The method of claim 1 wherein forming the multijunction solar cell further comprises forming the multijunction solar cell on a growth substrate comprised of a material selected from the group consisting of germanium, gallium arsenide, and silicon.

3. The method of claim 1 wherein the handle substrate is comprised of a material selected from the group consisting of silicon, silicon on sapphire, amorphous silicon, aluminum, and germanium.

4. The method of claim 1 wherein the multijunction solar cell is an inverted metamorphic solar cell.

5. The method of claim 1 wherein coupling the electrical connector element further comprises coupling an electrically conductive metal to the portion of the front surface of the handle substrate.

6. The method of claim 1 further comprising providing an interconnect element for attaching the solar cell assembly to a second solar cell assembly, wherein the at least one second contact of the solar cell assembly is attached to a top portion of the interconnect element, the first contact of the solar cell assembly is attached to a bottom portion of the interconnect element, and a middle portion of the interconnect element is attached to an electrical connector element of the second solar cell assembly.

7. The method of claim 1 further comprising enhancing performance of solar cell assemblies in satellites, spacecraft, solar powered aircraft, high altitude unmanned aircraft, aircraft, portable power devices, and dirigibles.

8. The method of claim 1 wherein providing the improved bypass protection further comprises, if the multijunction solar cell cracks, still protecting the multijunction solar cell against reverse bias degradation.

9. The method of claim 1 wherein forming the multijunction solar cell further comprises growing the multijunction solar cell on the first substrate and growing the plurality of solar cell layers via epitaxy.

10. The method of claim 1 wherein coupling the electrical connector element further comprises bonding with a conductive bonding material the electrical connector element to the portion of the front surface of the handle substrate.

11. The method of claim 1 wherein attaching the first surface of the multijunction solar cell further comprises bonding with a conductive bonding material the first surface of the multijunction solar cell to the front surface of the handle substrate.

12. The method of claim 1 wherein removing the first substrate further comprises removing the first substrate from the multijunction solar cell via etching.

13. The method of claim 1 wherein coupling the first contact further comprises coupling the first contact to the back surface of the handle substrate via vacuum deposition.

14. The method of claim 1 wherein coupling the at least one second contact further comprises coupling the at least one second contact to the portion of the second surface of the multijunction solar cell via vacuum deposition.

15. A method for enhancing performance of a solar cell assembly comprising:
growing on a first substrate a multijunction solar cell having a plurality of solar cell layers, wherein the multijunction solar cell has a first surface and a second surface;
providing a handle substrate having a front surface and a back surface, wherein the handle substrate has a p-n junction providing reverse bias protection, and wherein the handle substrate functions as a bypass diode;
bonding an electrical connector element to a portion of the front surface of the handle substrate;
bonding the first surface of the multijunction solar cell to the front surface of the handle substrate, wherein the electrical connector element is positioned adjacent the front surface of the handle substrate and the first surface of the multijunction solar cell;
removing via etching the first substrate from the multijunction solar cell;
attaching via vacuum deposition a first contact to the back surface of the handle substrate;
attaching via vacuum deposition at least one second contact to a portion of the handle surface of the multijunction solar cell; and,
providing improved bypass protection to the multijunction solar cell by combining the handle substrate and the bypass diode into one assembly with the entire front surface of the combined handle substrate and bypass diode in contact with the entire first surface of the multijunction solar cell.

16. The method of claim 15 further comprising providing an interconnect element for attaching the solar cell assembly to a second solar cell assembly, wherein the at least one second contact of the solar cell assembly is attached to a top portion of the interconnect element, the first contact of the solar cell assembly is attached to a bottom portion of the interconnect element, and a middle portion of the interconnect element is attached to an electrical connector element of the second solar cell assembly.

17. The method of claim 15 wherein providing the improved bypass protection further comprises, if the multijunction solar cell cracks, still protecting the multijunction solar cell against reverse bias degradation.

18. A method for enhancing performance of solar cell assemblies in satellites, spacecraft, solar powered aircraft, high altitude unmanned aircraft, aircraft, portable power devices, and dirigibles, the method comprising:
growing on a growth substrate a multijunction solar cell having a plurality of solar cell layers, wherein the multijunction solar cell has a first surface and a second surface;
providing a handle substrate having a front surface and a back surface, wherein the handle substrate has a p-n junction providing reverse bias protection, and wherein the handle substrate functions as a bypass diode;
bonding an electrical contact tab to a portion of the front surface of the handle substrate;
bonding the first surface of the multijunction solar cell to the front surface of the handle substrate, wherein the electrical contact tab is positioned adjacent the front surface of the handle substrate and the first surface of the multijunction solar cell;
removing via etching the growth substrate from the multijunction solar cell;
attaching via vacuum deposition a first metal contact to the back surface of the handle substrate; attaching via vacuum deposition at least one second metal contact to a portion of the second surface of the multijunction solar cell; and,
providing improved bypass protection to the multijunction solar cell by combining the handle substrate and the bypass diode into one assembly with the entire front surface of the combined handle substrate and bypass diode in contact with the entire first surface of the multijunction solar cell.

19. The method of claim 18 further comprising providing an interconnect element for attaching the solar cell assembly to a second solar cell assembly, wherein the at least one second metal contact of the solar cell assembly is attached to a top portion of the interconnect element, the first metal contact of the solar cell assembly is attached to a bottom portion of the interconnect element, and a middle portion of the interconnect element is attached to an electrical contact tab of the second solar cell assembly.

20. The method of claim 18 wherein providing the improved bypass protection further comprises, if the multijunction solar cell cracks, still protecting the multijunction solar cell against reverse bias degradation.

* * * * *